(12) United States Patent
Wicker

(10) Patent No.: US 8,889,527 B2
(45) Date of Patent: Nov. 18, 2014

(54) PHASE CHANGE MEMORY AND METHOD THEREFOR

(75) Inventor: Guy C. Wicker, Southfield, MI (US)

(73) Assignee: Intel Corporation, Santa Clara, CA (US)

( * ) Notice: Subject to any disclaimer, the term of this patent is extended or adjusted under 35 U.S.C. 154(b) by 1711 days.

(21) Appl. No.: 11/714,313

(22) Filed: Mar. 6, 2007

(65) Prior Publication Data
US 2007/0155117 A1    Jul. 5, 2007

Related U.S. Application Data

(62) Division of application No. 10/318,984, filed on Dec. 13, 2002, now Pat. No. 7,205,562.

(51) Int. Cl.
*H01L 21/20* (2006.01)
*H01L 45/00* (2006.01)
*H01L 27/24* (2006.01)

(52) U.S. Cl.
CPC ............ *H01L 45/06* (2013.01); *H01L 45/1226* (2013.01); *H01L 27/2436* (2013.01); *H01L 45/16* (2013.01); *H01L 45/1273* (2013.01); *H01L 45/122* (2013.01); *H01L 45/144* (2013.01)
USPC .......................................... 438/478; 438/666

(58) Field of Classification Search
USPC .................................................. 438/478, 666
See application file for complete search history.

(56) References Cited

U.S. PATENT DOCUMENTS

| | | | |
|---|---|---|---|
| 6,316,368 B1 * | 11/2001 | Lin et al. ........................ | 438/720 |
| 6,512,241 B1 * | 1/2003 | Lai ..................................... | 257/4 |
| 2003/0183867 A1 * | 10/2003 | Fricke et al. ................... | 257/314 |

* cited by examiner

*Primary Examiner* — Jae Lee
(74) *Attorney, Agent, or Firm* — Trop, Pruner & Hu, P.C.

(57) ABSTRACT

Briefly, in accordance with an embodiment of the invention, a phase change memory and a method to manufacture a phase change memory is provided. The phase change memory may include a memory material and a first tapered contact adjacent to the memory material. The phase change memory may further include a second tapered contact separated from the first tapered contact and adjacent to the memory material, wherein the first and second tapered contacts are adapted to provide a signal to the memory material.

8 Claims, 10 Drawing Sheets

PHASE CHANGE MEMORY AND METHOD THEREFOR

CROSS-REFERENCE TO RELATED APPLICATIONS

This application is a divisional of U.S. patent application Ser. No. 10/318,984, filed Dec. 13, 2002 now U.S. Pat. No. 7,205,562.

BACKGROUND

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states.

Typical materials suitable for such application include those utilizing various chalcogenide elements. The state of the phase change materials are also non-volatile in that, when set in either a crystalline, semi-crystalline, amorphous, or semi-amorphous state representing a resistance value, that value is retained until reset as that value represents a phase or physical state of the material (e.g., crystalline or amorphous).

Programming the phase change material to alter the phase or memory state of the material is accomplished by applying an electrical current through the material to heat the material. Reducing the current applied to the phase change material may be desirable to reduce power consumption of the memory device.

Thus, there is a continuing need for alternate phase change memory devices that reduce the current used to operate the phase change materials.

BRIEF DESCRIPTION OF THE DRAWINGS

The subject matter regarded as the invention is particularly pointed out and distinctly claimed in the concluding portion of the specification. The present invention, however, both as to organization and method of operation, together with objects, features, and advantages thereof, may best be understood by reference to the following detailed description when read with the accompanying drawings in which:

Figure 1:
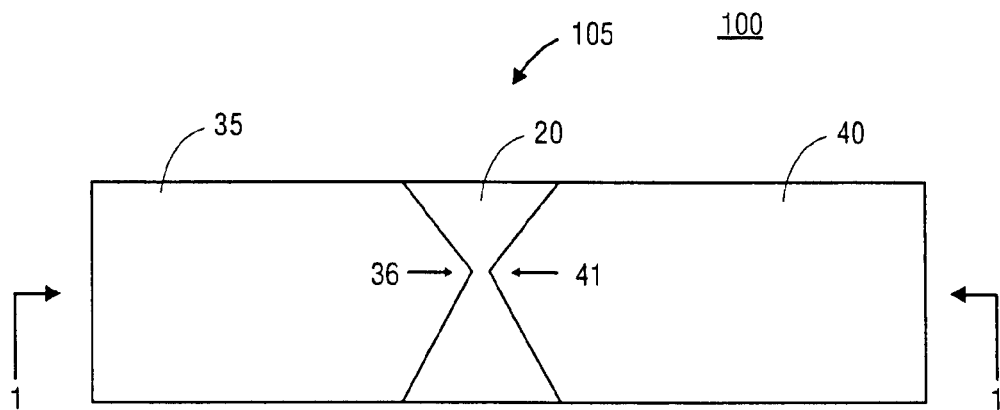
FIG. 1 is a top view of a portion of a memory element during fabrication in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Similarly, the terms "over" and "overlying," may be used and are not intended as synonyms for each other. In particular embodiments, "overlying" may indicate that two or more elements are in direct physical contact with each other, with one over the other. "Over" may mean that two or more elements are in direct physical contact, or may also mean that one is over the other and that the two elements are not in direct contact.

The term "adjacent" may or may not imply contact and may be used to indicate an absence of anything of the same kind in between. The term "adjoining" may imply meeting and touching at some point or line, and the term "contiguous" may imply having contact on all or most of one side.

The following description may include terms, such as over, under, upper, lower, etc. that are used for descriptive purposes only and are not to be construed as limiting. The embodiments of an apparatus or article of the present invention described herein can be manufactured, used, or shipped in a number of positions and orientations.

FIG. 1 is a top view of a portion of a memory 100 during manufacture in accordance with an embodiment of the present invention. Memory 100 may comprise a memory element 105 that may include two contacts 35 and 40 over an insulating material 20. Insulating material 20 may be formed over a substrate (e.g., substrate 10 illustrated in FIG. 2).

Figure 2:
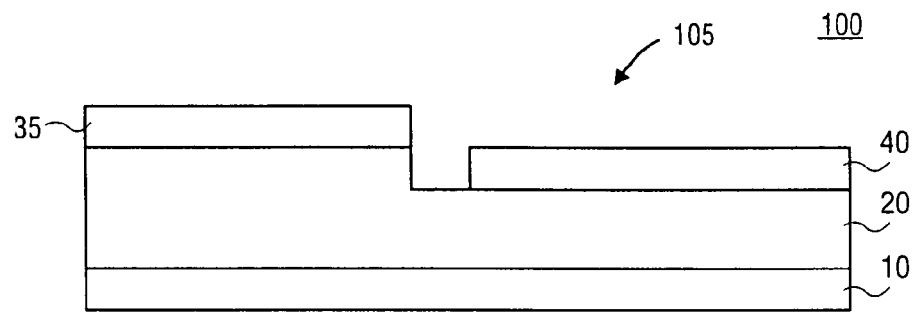
FIG. 2 is a cross-sectional view of the structure of FIG. 1 through line 1-1.

Turning briefly to FIG. 2, a cross-sectional view of the structure of FIG. 1 through section line 1-1 is illustrated in accordance with an embodiment of the present invention. In this embodiment, compared to contact 40, contact 35 may be formed at a relatively greater height above a top surface of substrate 10, which may be a semiconductor substrate such as, for example, a silicon substrate. Other suitable substrates may be, but are not limited to, substrates that contain ceramic material, organic material, or a glass material.

Figure 3:
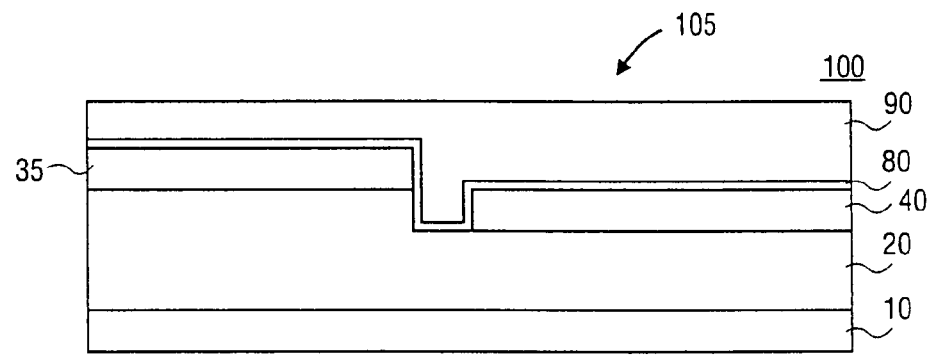
FIG. 3 is a cross-sectional view of the structure of FIG. 2 at a later stage of fabrication.

Turning briefly to FIG. 3, an embodiment of memory element 105 is illustrated at a later stage of manufacture in accordance with an embodiment of the present invention. FIG. 3 illustrates the structure shown in FIG. 2 after the formation of an insulating material 80 and a memory material 90.

In one embodiment, memory material 90 may be a nonvolatile, phase change material. In this embodiment, memory 100 may be referred to as a phase change memory. A phase change material may be a material having electrical properties (e.g. resistance) that may be changed through the application of energy such as, for example, heat, light, voltage potential, or electrical current. Examples of a phase change material may include a chalcogenide material or an ovonic material.

An ovonic material may be a material that undergoes electronic or structural changes and acts as a semiconductor when subjected to application of a voltage potential, an electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

Although the scope of the present invention is not limited in this respect, in one embodiment, contacts 35 and 40 may be electrodes adapted to provide an electrical signal to memory material 90 to store information using memory material 90.

For example, if memory material 90 is a non-volatile phase change material, then memory material 90 may be programmed into one of at least two memory states by applying a current to memory material 90 to alter the phase of memory material 90 between a substantially crystalline state and a substantially amorphous state, wherein a resistance of memory material 90 in the substantially amorphous state is greater than the resistance of memory material 90 in the substantially crystalline state. Accordingly, in this embodiment, memory material 90 may be adapted to be altered to one of at least two resistance values within a range of resistance values in response to an electrical signal provided using contacts 35 and 40 so as to provide single bit or multi-bit storage of information.

Programming of memory material 90 to alter the state or phase of the material may be accomplished by applying voltage potentials to contacts 35 and 40, thereby generating a voltage potential across memory material 90. An electrical current may flow through a portion of memory material 90 between contacts 35 and 40 in response to the applied voltage potentials, and may result in heating of memory material 90.

This heating may alter the memory state or phase of memory material 90. Altering the phase or state of memory material 90 may alter the electrical characteristic of memory material 90, e.g., the resistance of the material may be altered by altering the phase of the memory material 90. Memory material 90 may also be referred to as a programmable resistive material or simply a programmable material.

For example, a voltage potential difference of about three volts may be applied across a portion of memory material 90 by applying about three volts to contact 35 and about zero volts to contact 40. A current may flow through memory material 90 in response to the applied voltage potentials, and may result in heating of memory material 90. This heating and subsequent cooling may alter the memory state or phase of memory material 90.

In a "reset" state, memory material 90 may be in an amorphous or semi-amorphous state and in a "set" state, memory material 90 may be in an a crystalline or semi-crystalline state. The resistance of memory material 90 in the amorphous or semi-amorphous state may be greater than the resistance of memory material 90 in the crystalline or semi-crystalline state. It is to be appreciated that the association of reset and set with amorphous and crystalline states, respectively, is a convention and that at least an opposite convention may be adopted.

Using electrical current, memory material 90 may be heated to a relatively higher temperature to amorphisize memory material 90 and "reset" memory material 90 (e.g., program memory material 90 to a logic "0" value). Heating the volume of memory material 90 to a relatively lower crystallization temperature may crystallize memory material 90 and "set" memory material 90 (e.g., program memory material 90 to a logic "1" value). Various resistances of memory material 90 may be achieved to store information by varying the amount of current flow and duration through the volume of memory material 90.

The information stored in memory material 90 may be read by measuring the resistance of memory material 90. As an example, a read current may be provided to memory material 90 using contacts 35 and 40, and a resulting read voltage across memory material 90 may be compared against a reference voltage using, for example, a sense amplifier. (not shown). The read voltage may be proportional to the resistance exhibited by the memory cell. Thus, a higher voltage may indicate that memory material 90 is in a relatively higher resistance state, e.g., a "reset" state; and a lower voltage may indicate that the memory material 90 is in a relatively lower resistance state, e.g., a "set" state.

Although the scope of the present invention is not limited in this respect, in one embodiment, insulating material 80 may be a relatively thin layer of an electrically nonconductive material such as, for example, silicon nitride (SiN) having a thickness of, for example, less than about 20 angstroms (.ANG.).

Contacts 35 and 40 may have point contacts or tips (respectively labeled 36 and 41 in FIG. 1). A portion of insulating material 80 adjacent to the tips of contacts 35 and 40 may break down or degrade and conduct electrical current in response to an electric field generated by applying a voltage potential to contacts 35 and 40, wherein the voltage potential is greater than a breakdown voltage of insulating material 80. Insulating material 80 may be referred to as a breakdown material. In alternate embodiments, insulating material 80 may not be included in the memory element illustrated in FIG. 3 and memory material 90 may contact portions of contacts 35 and 40.

Insulating material 80, formed between memory material 90 and contacts 35 and 40, may confine the region of programming of memory material 90 to a region adjacent the tips of contacts 35 and 40. In other words, the region of memory material 90 subject to state or phase transitions in response to applied voltage potentials, is confined to a portion of memory material 90 adjacent the tips of contacts 35 and 40, which is less than the total volume of memory material 90. Accordingly, a smaller portion of memory material 90 may be subject to state or phase transitions, which may decrease the amount of energy (e.g., voltage/current) used to program memory material 90.

Although the scope of the present invention is not limited in this respect, contacts 35 and 40 may be formed a using an electrically conductive material such as, for example, titanium aluminum nitride (TiAlN). In the embodiment illustrated in FIGS. 1-3, contacts 35 and 40 may be tapered contacts adjacent to memory material 90.

Contacts 35 and 40 may be elongated, substantially planar layers formed in a plane or planes that may be substantially parallel to the top surface of substrate 10. As is illustrated in FIG. 1, contacts 35 and 40 may taper to a point or tip (labeled 36 and 41) in an area adjacent to memory material 90. In the embodiment illustrated in FIGS. 1-3, contacts 35 and 40 may be wedge-shaped and the tips may also be referred to as contact points. Other shapes that come to a point contact adjacent memory material 90 may also be possible. The tips of contacts 35 and 40 may be rounded or flat, or may form a peak.

Although the scope of the present invention is not limited in this respect, a cross-sectional diameter of the tips of contacts 35 and 40 may be less than about 500 angstroms. In one embodiment, the tips of contacts 35 and 40 may be separated by a sub-lithographic distance. In another embodiment, the distance between the tips of contacts 35 and 40 may be at least one feature size. In one example, the tips of contacts 35 and 40 may be separated by a distance of less than about 1000 angstroms.

The feature size of a structure may refer to the minimum dimension achievable using photolithography. For example, the feature size may refer to a width of a material or spacing of materials in a structure. As is understood, photolithography refers to a process of transferring a pattern or image from one medium to another, e.g., as from a mask to a wafer, using ultra-violet (UV) light. The minimum feature size of the transferred pattern may be limited by the limitations of the UV light. Distances, sizes, or dimensions less than the feature size may be referred to as sub-lithographic distances, sizes, or dimensions. For example, some structures may have feature sizes of about 2500 angstroms. In this example, a sub-lithographic distance may refer to a feature having a width of less than about 2500 angstroms.

Several techniques may be used to achieve sub-lithographic dimensions. Although the scope of the present invention is not limited in this respect, phase shift mask, electron beam lithography, x-ray lithography, or the use of sidewall spacers may be used to achieve sub-lithographic dimensions. Electron beam lithography may refer to a direct-write lithography technique using a beam of electrons to expose resist on a wafer. X-ray lithography may refer to a lithographic process for transferring patterns to a silicon wafer in which the electromagnetic radiation used is X-ray, rather than visible radiation. The shorter wavelength for X-rays (e.g., about 10-50 angstroms, versus about 2000-3000 angstroms for ultra-violet radiation) may reduce diffraction, and may be used to achieve feature sizes of about 1000 angstroms.

Even though contacts 35 and 40 are illustrated as being formed in different planes above substrate 10, this is not a limitation of the present invention. Although not shown, in alternate embodiments, contacts 35 and 40 may be formed substantially in the same plane above substrate 10.

The structure shown in FIG. 3 may be referred to as a memory element or memory cell and may be part of a memory array having a plurality of memory elements having the same structured illustrated in FIG. 3. The structure illustrated in FIG. 3 includes two point contacts underneath a memory material.

The structure illustrated in FIG. 3 may be referred to as a lateral memory element or cell, or simply a lateral memory since contacts 35 and 40 may be formed adjacent to or on opposite lateral portions of a memory material and current may flow in a substantial lateral direction through memory material 90 and contacts 35 and 40. In other words, current may flow through contacts 35 and 40 in a direction substantially parallel to a top surface of substrate 10. Contacts 35 and 40 may be referred to as lateral contacts. In alternate embodiments, contacts 35 and 40 may be vertical contacts formed in a vertical memory cell.

In other embodiments, memory 100 may be arranged differently and include additional layers and structures. For example, it may be desirable to form access or isolation structures (e.g., diodes, transistors), peripheral circuitry (e.g., addressing circuitry), etc. It should be understood that the absence of these elements is not a limitation of the scope of the present invention. In one embodiment, contacts 35 and 40 may be coupled to conductive address lines, e.g., word lines or bit lines.

FIGS. 4-21 may be used to illustrate one embodiment of the fabrication of a memory element 105. What is shown in FIG. 4 is a base layer of an insulating material 110 which may be formed over a substrate (not shown), although the scope of the present invention is not limited in this respect.

Insulating material 110 may be an electrically and/or thermally insulating material such as, for example, silicon dioxide (SiO.sub.2) or a composition that includes silicon nitride. Another insulating material 120 may be deposited overlying insulating material 110. Insulating material 120 may also be referred to as an insulator or an insulating layer. In one embodiment, insulating material 120 may be a layer of silicon dioxide (SiO.sub.2), although the scope of the present invention is not limited in this respect. Insulating material 120 may have a thickness ranging from about 500 angstroms to about 3,000 angstroms, although the scope of the present invention is not limited in this respect. In one embodiment, the thickness of insulating material 120 may be about 1000 angstroms.

After deposition, a portion of insulating material 120 may be removed using, for example, photolithographic and etch techniques. As an example, a portion of insulating material 120 may be removed by applying a layer of photoresist material (not shown) on insulating material 120 and exposing this photoresist material to light. A mask such as, for example, the mask 130 shown in FIG. 5 may be used to expose selected areas of the photoresist material, which defines areas to be removed. The etch may be a chemical etch, which may be referred to as a wet etch. Or, the etch may be an electrolytic or plasma (ion bombardment) etch, which may be referred to as a dry etch. Mask 130 may be referred to as a trapezoidal or tapering mask. A tapering mask or structure may refer to a shape that progressively narrows toward one end.

Figure 4:
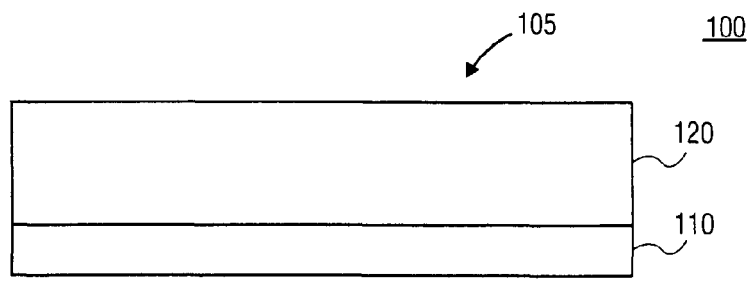
FIG. 4 is a cross-sectional view of a portion of a memory element during fabrication in accordance with an embodiment of the present invention.
Figure 5:
FIG. 5 is a top view of a mask in accordance with an embodiment of the present invention.
Figure 6:
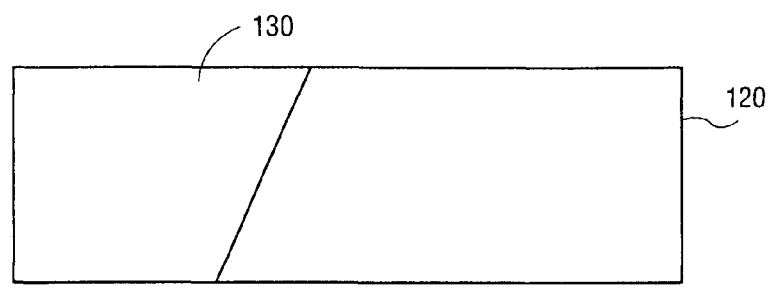
FIG. 6 is a top view illustrating the mask of FIG. 5 over the structure shown in FIG. 4.
Figure 7:
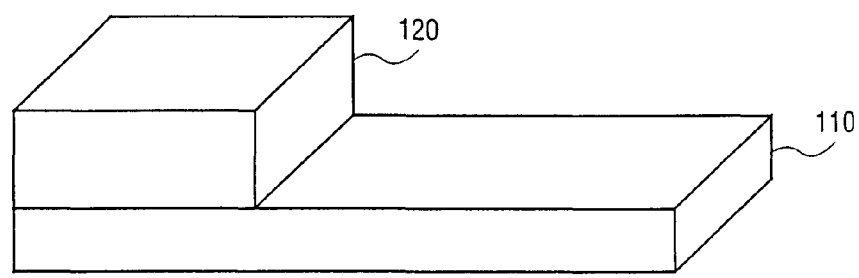
FIG. 7 is a three-dimensional view of the structure of FIG. 4 at a later stage of fabrication.
Figure 8:
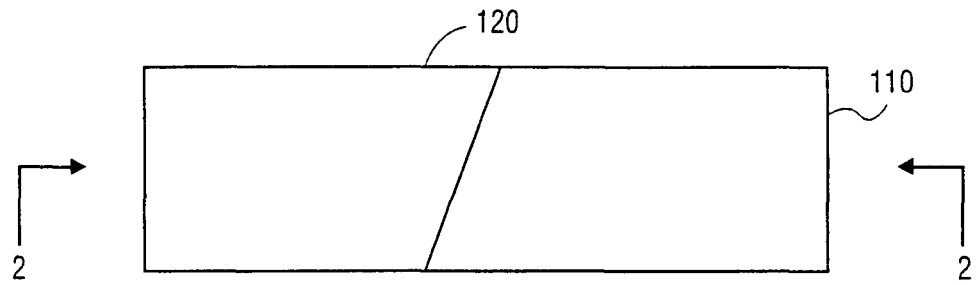
FIG. 8 is a top view of the structure of FIG. 7 at the stage of fabrication illustrated in FIG. 7.
Figure 9:
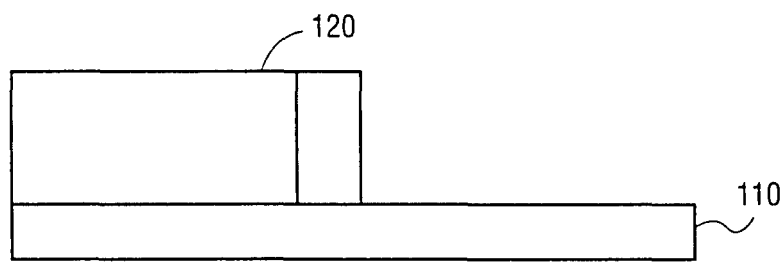
FIG. 9 is a cross-sectional view of the structure of FIG. 8 through line 2-2.

FIG. 6 is a top view illustrating mask 130 over the structure shown in FIG. 4 prior to etching. Insulating material 120 may be patterned using mask 130 to form the pillar or step structure illustrated in FIG. 7. FIG. 8 is a top view of the structure illustrated in FIG. 7, showing that the step structure has a trapezoidal or tapering shape and may be referred to as a trapezoidal or tapering step structure. FIG. 9 is a cross-sectional view of the structure of FIG. 8 through section line 2-2.

Although the step structure shown in FIG. 7 is described as being formed using a photolithographic technique, this is not a limitation of the present invention. In another embodiment, the step structure shown in FIG. 7 may be formed using hard mask techniques. For example, mask 130 may be a hard mask material such as, for example, polycrystalline silicon, amorphous silicon, or silicon nitride. Mask 130 may be formed over insulating material 120 as shown in FIG. 6, then portions of insulating material 120 under mask 130 may be preserved while portions not under mask 130 may be removed using, for example, an etch process.

Figure 10:
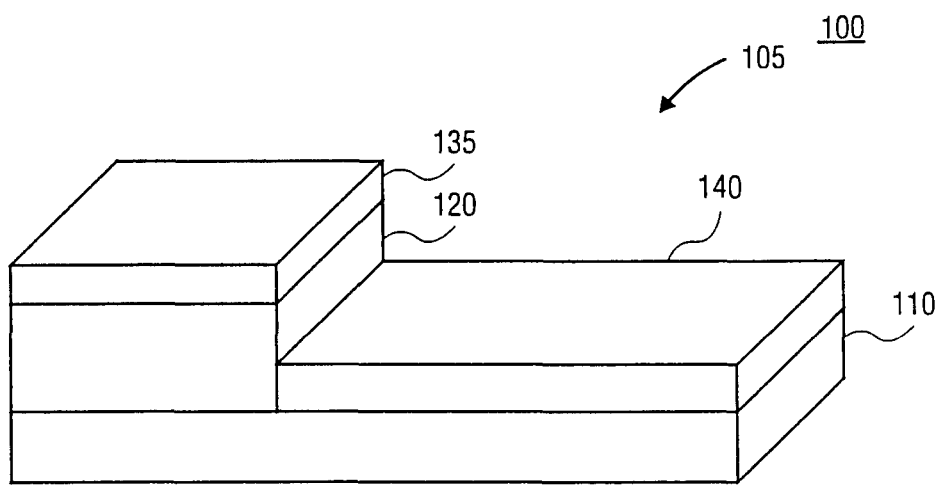
FIG. 10 is a three-dimensional view of the structure of FIG. 7 at a later stage of fabrication.

FIG. 10 illustrates memory element 105 after the forming of contacts 135 and 140 which may be formed by depositing a single layer of an electrode material over insulating materials 120 and 110. The electrode material may be deposited using a physical vapor deposition (PVD) process to sputter the electrode material over the top surfaces of insulating materials 120 and 110. The electrode material is sputtered at a predetermined thickness so that contact 135 is electrically isolated from contact 140. In one embodiment, the thickness of the electrode material is less than about 1000 angstroms. An isotropic etch back of the electrode material, i.e., contacts 135 and 140, may be used to ensure electrical isolation by removing any of the electrode material that may have inadvertently been formed along the sidewall of insulating material 120 between electrodes 135 and 140. As may be appreciated, contact 135 may be separated from contact 140 by a distance approximately equal to a thickness of the electrode material minus a height of the step structure.

Although the scope of the present invention is not limited in this respect, in one embodiment, the electrode material used to form contacts 135 and 140 may be an electrically conductive material. Examples of the electrode material may include titanium aluminum nitride (TiAlN), titanium silicon nitride (TiSiN), or tantalum nitride (TaN). The electrode material may have a thickness of less than about 1000 angstroms, although the scope of the present invention is not limited in this respect.

Figure 11:
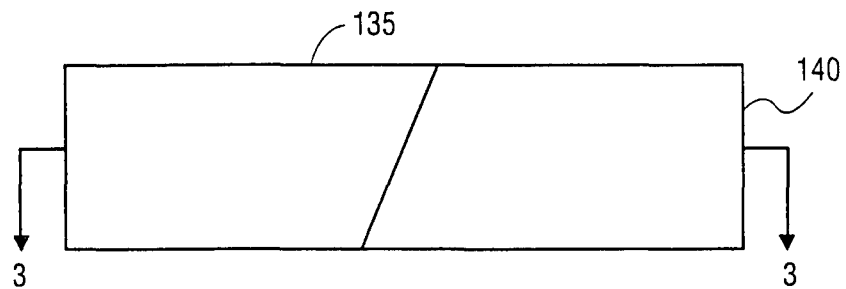
FIG. 11 is a top view of the structure of FIG. 10 at the stage of fabrication illustrated in FIG. 10.
Figure 12:
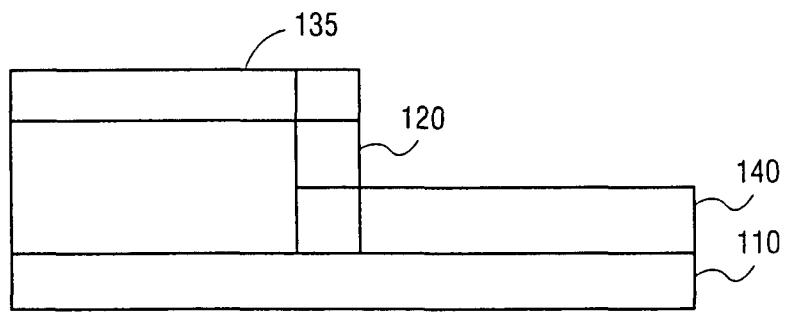
FIG. 12 is a cross-sectional view of the structure of FIG. 11 through line 3-3.

FIG. 11 is a top view of the structure shown in FIG. 10 and may be used to show that one side of contact 135 and one side of contact 140 is angled so that contacts 135 and 140 have a trapezoidal or tapering shape. FIG. 12 is a cross-sectional view of the structure of FIG. 8 through section line 3-3.

Figure 13:
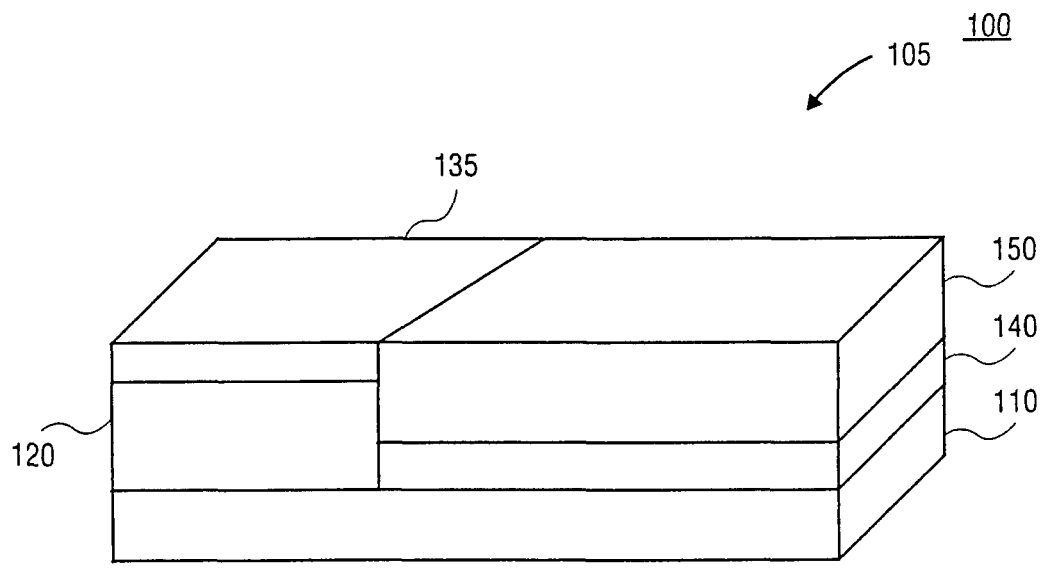
FIG. 13 is a three-dimensional view of the structure of FIG. 10 at a later stage of fabrication.

FIG. 13 illustrates memory element 105 after the formation of an insulating material 150 overlying contact 140. Insulating material 150 may be formed using a chemical vapor deposition (CVD) process and may be an electrically and/or thermally nonconductive material such as, for example, silicon dioxide, although the scope of the present invention is not limited in this respect. Insulating material 150 may have a thickness of greater than about 1000 angstroms, although the scope of the present invention is not limited in this respect.

Figure 14:
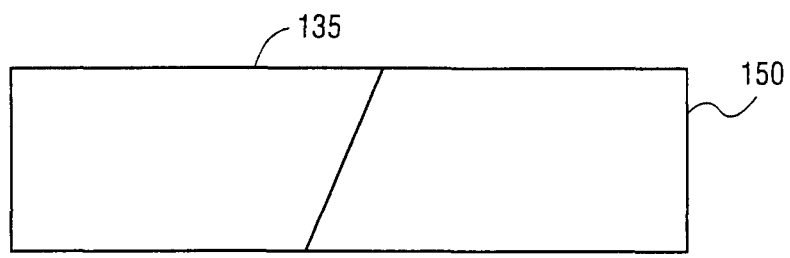
FIG. 14 is a top view of the structure of FIG. 13 at the stage of fabrication illustrated in FIG. 13.

In one embodiment, insulating material 150 may be formed overlying electrodes 140 and 135 and then may be planarized to remove a portion of insulating material 150 over contact 135 and form insulating material 150 so that a top surface of insulating material 150 is level or planar to a top surface of contact 135. Suitable planarization techniques may include a chemical or chemical-mechanical polish (CMP) technique. FIG. 14 is a top view of the structure illustrated in FIG. 13.

Figure 15:
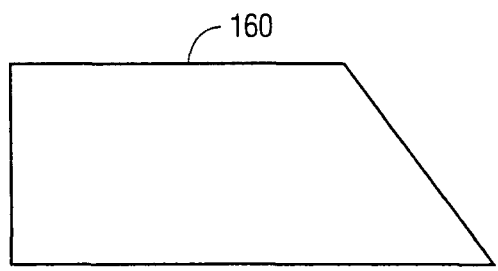
FIG. 15 is a top view of a mask in accordance with an embodiment of the present invention.
Figure 16:
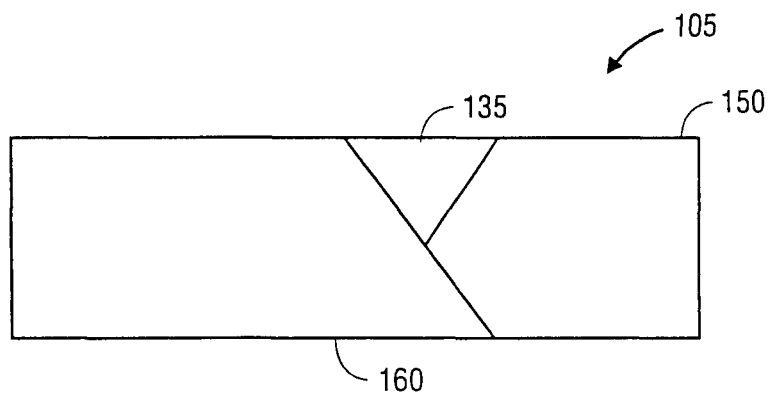
FIG. 16 is a top view illustrating the mask of FIG. 15 over the structure shown in FIG. 13.

The structure shown in FIG. 13 may be patterned using a mask 160 as shown in FIG. 15. FIG. 16 is a top view illustrating mask 160 over the structure shown in FIG. 13 prior to etching. Contact 135 and insulating materials 120 and 150 may be patterned using mask 160, which may be a tapering or trapezoidal mask. Turning briefly to FIG. 16, in this embodiment, mask 160 may be orthogonally positioned relative to the position of mask 130 (discussed above) over the memory element structure to remove portions of contact 135 and insulating materials 120 and 150 to form tapered contacts 135 and 150 as is illustrated in the views shown in FIGS. 17-19.

Figure 17:
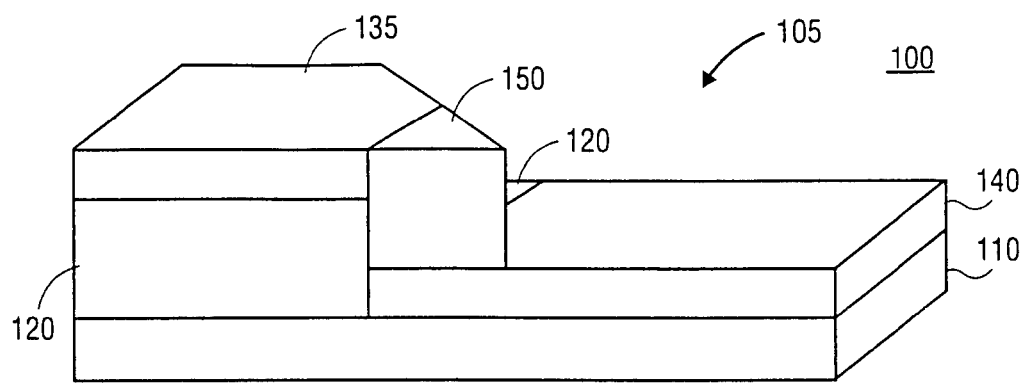
FIG. 17 is a three-dimensional view of the structure of FIG. 13 at a later stage of fabrication.
Figure 18:
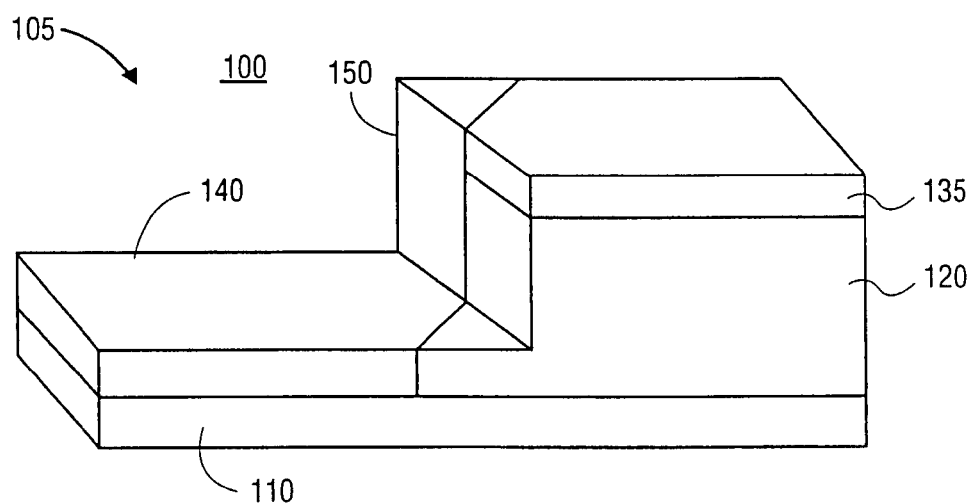
FIG. 18 is another three-dimensional view of the structure of FIG. 13 at the stage of fabrication illustrated in FIG. 17.
Figure 19:
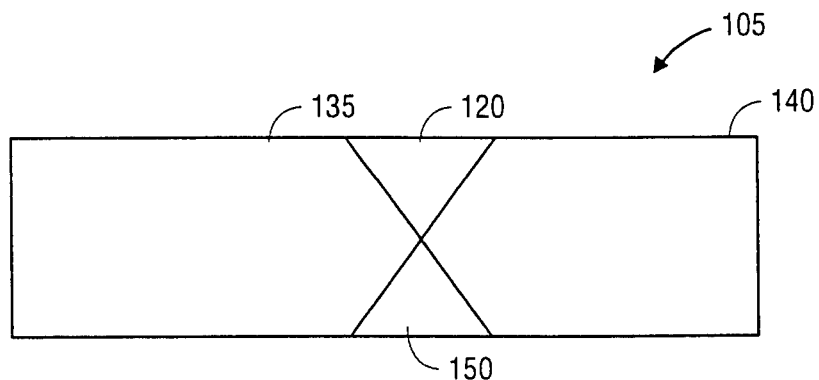
FIG. 19 is a top view of the structure of FIGS. 17 and 18.

FIGS. 17 and 18 are alternate three-dimensional views of the structure illustrated in FIG. 13 at a later stage of fabrication. FIG. 19 is a top view of the structure illustrated in FIGS. 17 and 19. FIGS. 17-19 illustrate memory 105 after patterning of materials 120, 150, and 135 using mask 160.

Figure 20:
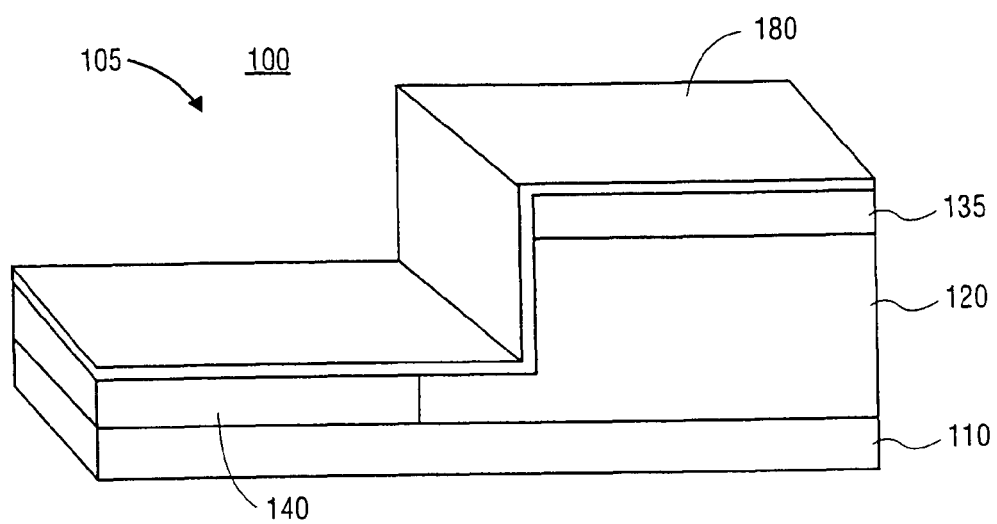
FIG. 20 is a three-dimensional view of the structure of FIG. 18 at a later stage of fabrication.

FIG. 20 illustrates the structure shown in FIG. 19 after depositing a layer of an insulating material 180 using a CVD process. Although the scope of the present invention is not limited in this respect, insulating material 180 may be a breakdown material having a thickness of less than about 20 angstroms. Examples of insulating material 180 may include silicon nitride or silicon dioxide.

Figure 21:
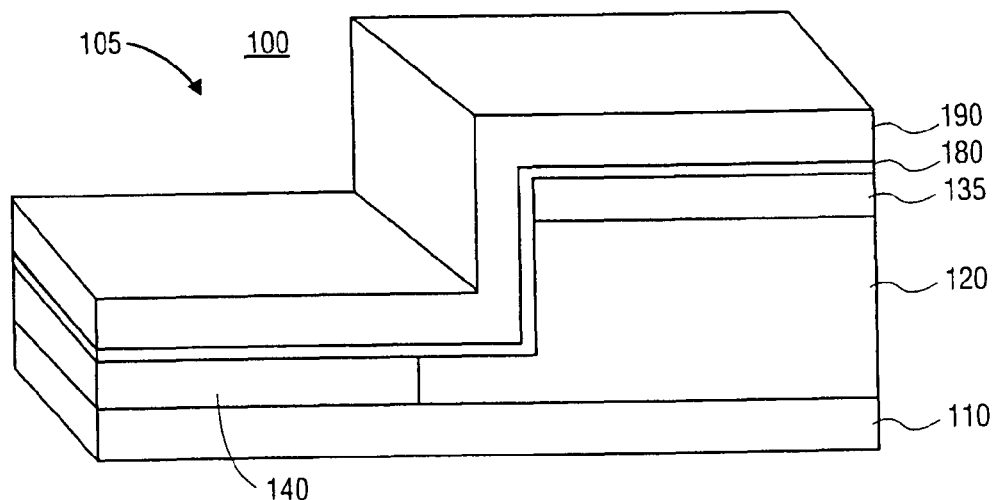
FIG. 21 is a three-dimensional view of the structure of FIG. 20 at a later stage of fabrication.

FIG. 21 illustrates the structure shown in FIG. 20 after depositing a layer of a memory material 190 overlying insulating material 180 using, for example, a physical vapor deposition (PVD) process. The thickness of memory material 190 may range from about 150 angstroms to about 600 angstroms.

Memory material 190 may be a non-volatile, phase change material capable of being programmed into one of at least two memory states by applying a current to memory material 190 to alter the phase of memory material 190 between a substantially crystalline state and a substantially amorphous state, wherein a resistance of memory material 190 in the substantially amorphous state is greater than the resistance of memory material 190 in the substantially crystalline state.

Memory material 190 may be an ovonic material or a chalcogenide material. Examples of phase change material 190 may include, but are not limited to, chalcogenide element(s) compositions of the class of tellurium-germanium-antimony ($Te_xGe_ySb_z$) material or TeGeSb alloys, although the scope of the present invention is not limited to just these. Alternatively, another phase change material may be used whose electrical properties (e.g. resistance) may be changed through the application of energy such as, for example, light, heat, or electrical current.

As is illustrated in the embodiment illustrated in FIGS. 4-21, memory material 190 may be formed after forming contacts 135 and 140. In this embodiment, memory material 190 and contacts 135 and 140 may be processed at different temperatures. For example, contacts 135 and 140 may be formed at a greater temperature or temperatures than memory material 190. In one embodiment, contacts 135 and 140 may be deposited above a temperature of about 700 degrees Celsius (.degree. C.). Memory material 190 may be deposited at a temperature below about 400 degrees Celsius.

It should be noted that the region of programming may be confined or constrained using the structure illustrated in FIG. 21 that has point contacts that are separated by a relatively small distance. The region of programming, i.e., the volume of memory material 90 that may change state or phase, may be limited to a region near the tips of contacts 135 and 140. Compared to other memory structures, the structure illustrated in FIG. 21 may use less energy (e.g., electrical current) during programming and reading.

As may be appreciated, in the embodiment illustrated in FIGS. 4-21, sub-lithographic spacing between the tips of contacts 135 and 140 may be achieved using only photolithographic and etch techniques, without using techniques such as phase shift masking, electron beam lithography, x-ray lithography, or the use of sidewall spacers.

Figure 22:
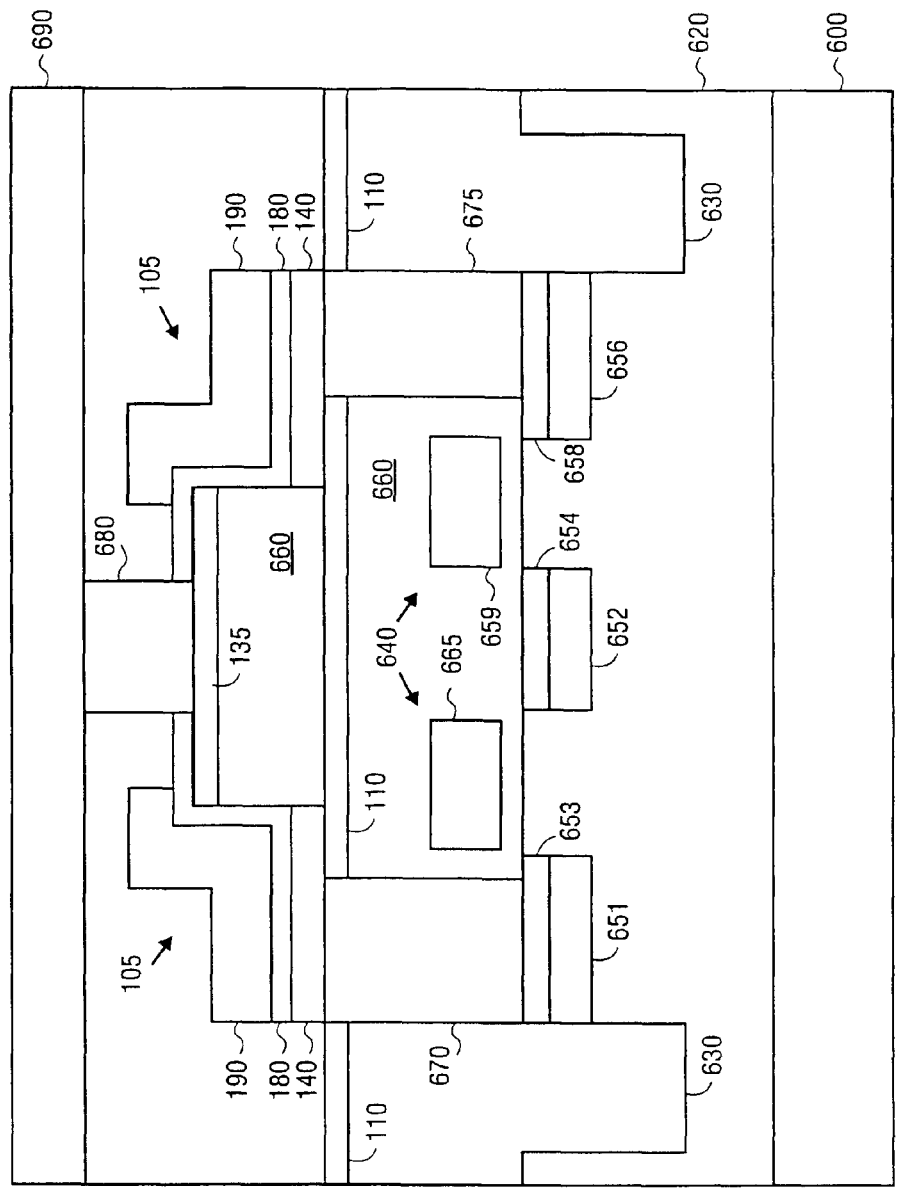
FIG. 22 is a cross-sectional view of a portion of a memory in accordance with an embodiment of the present invention.

Turning to FIG. 22, an embodiment of memory 100 is illustrated. Memory 100 may include memory elements 105. Memory 100 may also include additional structures such as switching or select devices (e.g., transistors or diodes), isolation structures, and address lines.

In the embodiment illustrated in FIG. 22, memory 100 comprises a substrate 600 that may be formed from a semiconductor material. In this embodiment, a P-type dopant such as, for example, boron may be introduced in substrate 600. In one example, although the scope of the present invention is not limited in this respect, a suitable concentration of P-type dopant is on the order of above about $5 \times 10^{18}$ to about $1 \times 10^{20}$ atoms per cubic centimeters (atoms/cm$^3$), rendering substrate 600 representatively P++. Overlying substrate 600, in this example, may be P-type epitaxial silicon 620. In one example, the dopant concentration is on the order of about $10^{15}$ to $10^{17}$ atoms/cm$^3$.

Memory 100 may also include shallow trench isolation (STI) structures 630 formed in epitaxial silicon 620. STI structures 630 may serve to isolate individual memory elements from one another as well as associated circuit elements (e.g., transistor devices) formed in and on the substrate. In one embodiment, STI structure 630 may be silicon dioxide, although the scope of the present invention is not limited in this respect.

Memory 100 may further include select devices 640 that may be part of the address circuitry. Select devices 640 may be two metal-oxide semiconductor field effect transistors (MOSFETs). One transistor may include regions 651 and 652, conductive materials 653 and 654, and a gate 665. The other transistor may include a regions 652 and 656, conductive materials 654 and 658, and a gate 659.

Regions 651, 652, and 656 may be N-type doped polysilicon formed by the. introduction of, for example, phosphorous or arsenic to a concentration on the order of about $10^{18}$ to about $10^{20}$ atoms/cm$^3$ (e.g., N+ silicon), although the scope of the present invention is not limited in this respect. Conductive materials 653, 654, and 658 may be, in one example, a refractory metal silicide such as cobalt silicide (CoSi$_2$). Conductive materials 653, 654, and 658, in one aspect, may serve as a low resistance material in the fabrication of peripheral circuitry (e.g., addressing circuitry) of the circuit structure on the chip. Conductors 652 and 654 together may serve as the a drain or source terminal of select device 640.

Gates 665 and 659 of select devices 640 may be formed, in one example, from a polysilicon material. In this example, gates 665 and 659 may be used as a signal line or an address line. Gates 665 and 659 may be used as a row or word line (e.g., word line 715 of FIG. 23). It is to be appreciated that the association of word line or row line is a convention and that other conventions may be adopted. For example, gates 665 and 659 and address line 715 may be referred to as a column line or a bit line.

A dielectric material 660 such as, for example, SiO$_2$, may be formed surrounding gates 665 and 659. Conductive contacts 670, 675, and 680 may be formed from a conductive material such as, for example, tungsten. Conductor 690 may be formed from a conductive material, such as, for example, aluminum. Contacts 680 and 690 may together serve as an address line, e.g., a bit line or column line (e.g. bit lines 720 in FIG. 23). Again, it is to be appreciated that the association of bit line or column line is a convention and that other conventions may be adopted. For example, contacts 680 and 690 and address line 720 may be referred to as a row line or a word line.

It should be noted that the order or sequence of the operations described above to form memory 100 is not a limitation of the present invention.

Figure 23:
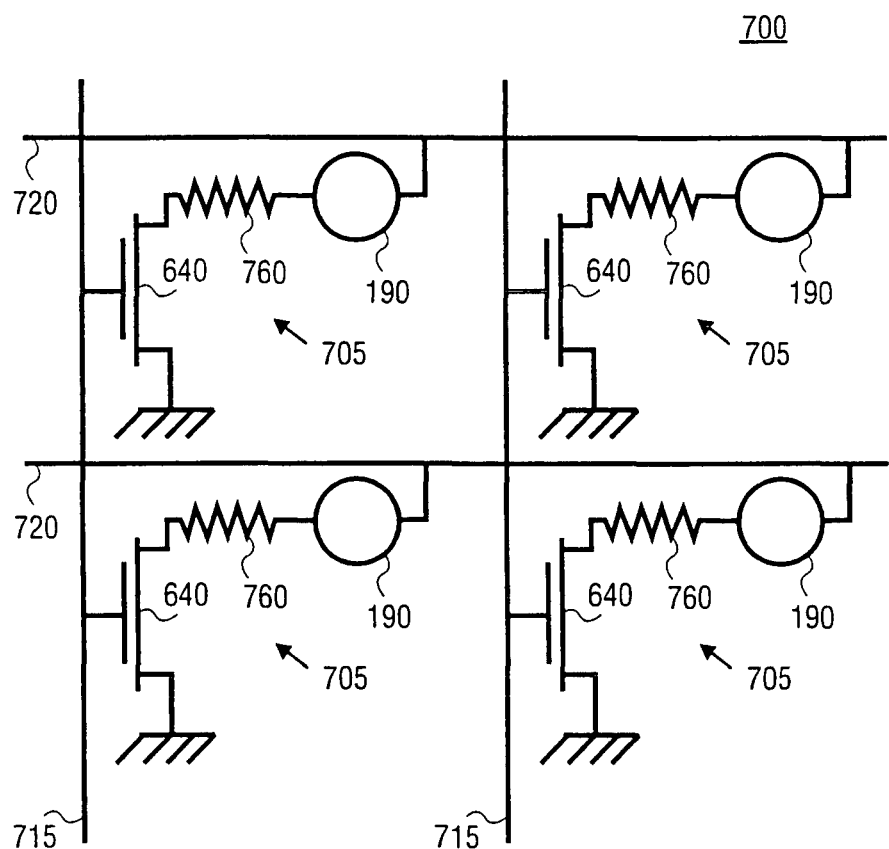
FIG. 23 is a schematic diagram illustrating a memory array in accordance with an embodiment of the present invention.

FIG. 23 is a schematic diagram of an embodiment of a memory array 700. Memory array 700 may include a plurality of memory elements 705 that may be formed as memory element 105 described above. In this example, the circuit of memory array 700 includes address lines 715 and 720 that may be used to program or read memory elements 705. Address lines 715 and 720 may be coupled, in one embodiment, to external addressing circuitry (not shown). Memory elements 705 may comprise a MOSFET 640, a resistor 760, and a memory material 190.

Figure 24:
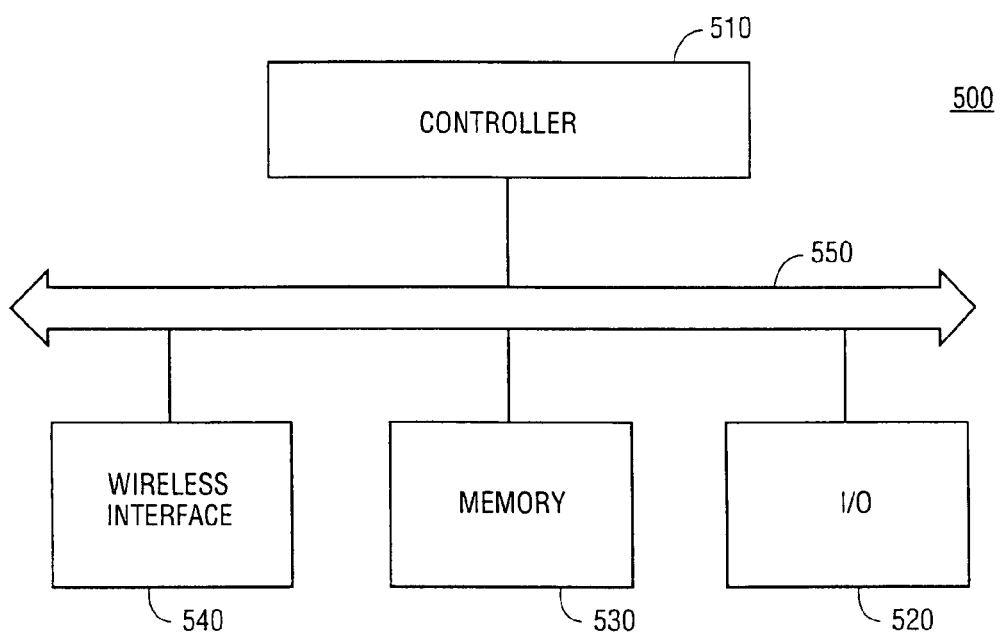
FIG. 24 is a block diagram illustrating a portion of a system in accordance with an embodiment of the present invention.

Turning to FIG. 24, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory 100 discussed herein.

I/O device 520 may be used by a user to generate a message. System 500 may use wireless interface 540 to transmit. and receive messages to and from a wireless communication network with a radio frequency (RF) signal. Examples of wireless interface 540 may include an antenna or a wireless transceiver, although the scope of the present invention is not limited in this respect.

Although the scope of the present invention is not limited in this respect, system 500 may use one of the following communication air interface protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, or the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A method, comprising:
   forming a memory material over a substrate;
   forming a first wedge-shaped contact adjacent to the memory material; and
   forming a second wedge-shaped contact separated from the first wedge-shaped contact by a distance of less than 2500 Angstroms and adjacent to the memory material; and
   said first and second wedge-shaped contacts tapering towards one another.

2. The method of claim 1,
   wherein forming the memory material occurs after forming the first wedge-shaped contact and after forming the second wedge-shaped contact; and
   wherein forming the first wedge-shaped contact includes forming the first wedge-shaped contact at or above a first temperature, forming the second wedge-shaped contact includes forming the second wedge-shaped contact at or above the first temperature, and forming the memory material includes forming the memory material below the first temperature.

3. The method of claim 1,
   wherein forming the first wedge-shaped contact includes depositing the first wedge-shaped contact above a temperature of about 700 degrees Celsius;
   wherein forming the first wedge-shaped contact includes depositing the first wedge-shaped contact above a temperature of about 700 degrees Celsius; and
   wherein forming the memory material includes depositing the memory material at a temperature below about 400 degrees Celsius.

4. The method of claim 1, wherein forming the first wedge-shaped contact and forming the second wedge-shaped contact includes:
   depositing a first insulating material over the substrate;
   removing a portion of the first insulating material to form a step structure; and
   depositing a conductive material overlying the step structure to form a first contact and a second contact from the conductive material, wherein the first contact is separated from second contact by a distance approximately equal to a thickness of the conductive material minus a height of the step structure.

5. The method of claim 4, wherein removing includes patterning the first insulating material using a first trapezoidal mask to remove the portion of the first insulating material to form the step structure, wherein the step structure is a trapezoidal step structure.

6. The method of claim 5, forming the first wedge-shaped contact and forming the second wedge-shaped contact further includes:
   depositing a second insulating material over the first and second contacts;
   removing a portion of the second insulating material; and
   patterning the second insulating material and the first contact using a second trapezoidal mask orthogonally positioned from the first trapezoidal mask to remove the portion of the second insulating material and a portion of the first contact to form the first wedge-shaped contact and the second wedge-shaped contact.

7. The method of claim 1 further including separating said wedge-shaped signal-carrying contacts by a distance less than about 1000 Angstroms.

8. A method, comprising:
   forming a memory material over a substrate;
   forming a first wedge-shaped contact adjacent to the memory material; and
   forming a second wedge-shaped contact separated from the first wedge-shaped contact and adjacent to the memory material;
   wherein forming the first wedge-shaped contact and forming the second wedge-shaped contact includes:
      depositing a first insulating material over the substrate;
      removing a portion of the first insulating material to form a step structure by patterning the first insulating material using a first trapezoidal mask to remove the portion of the first insulating material to form the step structure, wherein the step structure is a trapezoidal step structure;
      depositing a conductive material overlying the step structure to form a first contact and a second contact from the conductive material, wherein the first contact is separated from second contact by a distance approximately equal to a thickness of the conductive material minus a height of the step structure;
      depositing a second insulating material over the first and second contacts;
      removing a portion of the second insulating material; and
      patterning the second insulating material and the first contact using a second trapezoidal mask orthogonally positioned from the first trapezoidal mask to remove the portion of the second insulating material and a portion of the first contact to form the first wedge-shaped contact and the second wedge-shaped contact.

* * * * *